United States Patent
Park et al.

(10) Patent No.: US 9,825,114 B2
(45) Date of Patent: Nov. 21, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-Do (KR)

(72) Inventors: Jonghyun Park, Yongin-si (KR); Yulkyu Lee, Yongin-si (KR); Myungkoo Hur, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/873,228

(22) Filed: Oct. 2, 2015

(65) Prior Publication Data
US 2016/0197127 A1 Jul. 7, 2016

(30) Foreign Application Priority Data
Jan. 2, 2015 (KR) .......................... 10-2015-0000293

(51) Int. Cl.
*H01L 27/32* (2006.01)

(52) U.S. Cl.
CPC ...... *H01L 27/3276* (2013.01); *H01L 27/3223* (2013.01)

(58) Field of Classification Search
CPC .............................. H01L 27/3246; H01L 51/56
USPC .......................................................... 257/40
See application file for complete search history.

(56) References Cited

U.S. PATENT DOCUMENTS

| | | | |
|---|---|---|---|
| 2003/0227078 A1* | 12/2003 | Chang | G02F 1/1345 257/693 |
| 2004/0253756 A1 | 12/2004 | Cok et al. | |
| 2007/0131932 A1 | 6/2007 | Shin et al. | |
| 2008/0179593 A1* | 7/2008 | Lim | H01L 27/12 257/59 |
| 2009/0278443 A1* | 11/2009 | Terada | H01L 51/5237 313/504 |
| 2010/0102335 A1 | 4/2010 | Takagi et al. | |
| 2010/0187538 A1* | 7/2010 | Koo | H01L 27/1288 257/72 |
| 2010/0244025 A1* | 9/2010 | Liou | H01L 27/1255 257/48 |
| 2011/0115765 A1* | 5/2011 | Chang | G02F 1/1339 345/206 |

(Continued)

FOREIGN PATENT DOCUMENTS

| | | |
|---|---|---|
| JP | 2005-011810 A | 1/2005 |
| JP | 2006-286493 A | 10/2006 |
| JP | 2010-108693 A | 5/2010 |

*Primary Examiner* — Fernando L Toledo
*Assistant Examiner* — Adam S Bowen
(74) *Attorney, Agent, or Firm* — Lee & Morse, P.C.

(57) ABSTRACT

An organic light-emitting display apparatus, including a substrate including a display region and a fan-out region outside the display region; a plurality of pixel electrodes in the display region of the substrate; a plurality of first signal lines connected electrically to the pixel electrodes in the display region in one direction and constituting a plurality of first line portions in the fan-out region; a plurality of second signal lines connected electrically to the pixel electrodes in the display region to intersect the first signal lines and constituting a plurality of second line portions in the fan-out region; and a dummy pattern between the first line portions.

18 Claims, 7 Drawing Sheets

(56) References Cited

U.S. PATENT DOCUMENTS

2011/0211145 A1* 9/2011 Tsuruma .......... G02F 1/133512
349/106
2014/0009707 A1 1/2014 Jung et al.

* cited by examiner

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2015-0000293, filed on Jan. 2, 2015, in the Korean Intellectual Property Office, and entitled: "Organic Light-Emitting Display Apparatus and Method of Manufacturing the Same," is incorporated by reference herein in its entirety.

BACKGROUND

1. Field

One or more exemplary embodiments relate to organic light-emitting display apparatuses and methods of manufacturing the same.

2. Description of the Related Art

Among display apparatuses, organic light-emitting display apparatuses may exhibit wide viewing angle, high contrast ratio, and high response speed.

SUMMARY

Embodiments may be realized by providing an organic light-emitting display apparatus, including a substrate including a display region and a fan-out region outside the display region; a plurality of pixel electrodes in the display region of the substrate; a plurality of first signal lines connected electrically to the pixel electrodes in the display region in one direction and constituting a plurality of first line portions in the fan-out region; a plurality of second signal lines connected electrically to the pixel electrodes in the display region to intersect the first signal lines and constituting a plurality of second line portions in the fan-out region; and a dummy pattern between the first line portions.

The first signal lines may be gate lines, and the second signal lines may be data lines.

The dummy pattern may be on a same layer as the first signal lines.

The organic light-emitting display apparatus may further including an opposite electrode facing the pixel electrodes. The dummy pattern may be electrically connected to the opposite electrode.

The opposite electrode may extend to the fan-out region.

The organic light-emitting display apparatus may further include a metal layer between the dummy pattern and the opposite electrode.

The dummy pattern between the first line portions may be approximately triangular.

The substrate may further include a sealing region outside the fan-out region, and a guide line may be outside of the sealing region.

A first line pattern may be on the fan-out region, and a first portion of the first line pattern may be electrically connected to the dummy pattern.

A second line pattern may be on the sealing region, and a second end portion of the first line pattern may be electrically connected to a first portion of the second line pattern.

The second end portion of the second line pattern may be electrically connected to the guide line.

The organic light-emitting display apparatus may further include a metal layer between the dummy pattern and the first portion of the first line pattern and a metal layer between the second end portion of the first line pattern and a first end portion of the second line pattern.

The first line pattern may be on a same layer as the pixel electrodes.

Embodiments may be realized by providing a method of manufacturing an organic light-emitting display apparatus, the method including preparing a substrate including a display region and a fan-out region outside the display region; patterning a plurality of pixel electrodes in the display region of the substrate; forming a plurality of first line portions including a plurality of first signal lines connected electrically to the pixel electrodes in the display region in one direction and concentrated in the fan-out region; forming a plurality of second line portions including a plurality of second signal lines connected electrically to the pixel electrodes in the display region to intersect the first signal lines and concentrated in the fan-out region; and forming a dummy pattern between the first line portions.

The first signal lines may be gate lines, and the second signal lines may be data lines.

The dummy pattern may be formed simultaneously with the first signal lines.

The method may further include forming an opposite electrode facing the pixel electrodes. The dummy pattern may be electrically connected to the opposite electrode.

The opposite electrode may extend to the fan-out region.

The method may further include forming a metal layer between the dummy pattern and the opposite electrode to electrically connect the dummy pattern and the opposite electrode.

The dummy pattern may be approximately triangular.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments will be described in detail with reference to the accompanying drawings. In the following description, like reference numerals denote like elements, and redundant descriptions thereof will be omitted.

It will be understood that although the terms "first", "second", etc., may be used herein to describe various components, these components should not be limited by these terms. These terms are only used to distinguish one component from another. As used herein, the singular forms "a", "an", and "the" are intended to include the plural forms as well, unless the context clearly indicates otherwise.

It will be further understood that the terms "comprise", "include", and "have" used herein specify the presence of stated features or components, but do not preclude the presence or addition of one or more other features or components. It will be understood that when a layer, region, or component is referred to as being "formed on" another layer, region, or component, it may be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Sizes of elements in the drawings may be exaggerated for convenience of description. In other words, since sizes and thicknesses of elements in the drawings are arbitrarily illustrated for convenience of description, the following embodiments are not limited thereto.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 1:
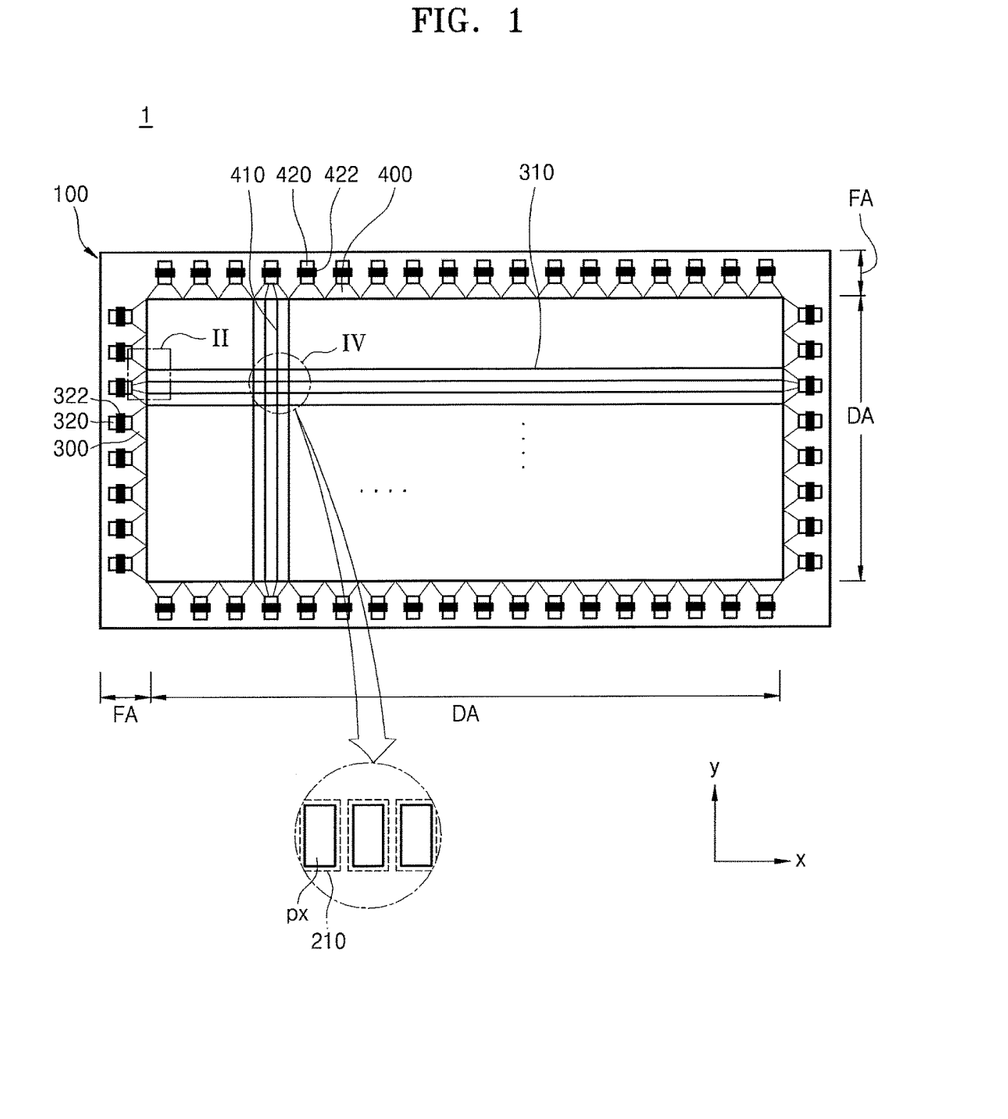
FIG. 1 illustrates a schematic plan view of an organic light-emitting display apparatus according to an exemplary embodiment.
Figure 2:
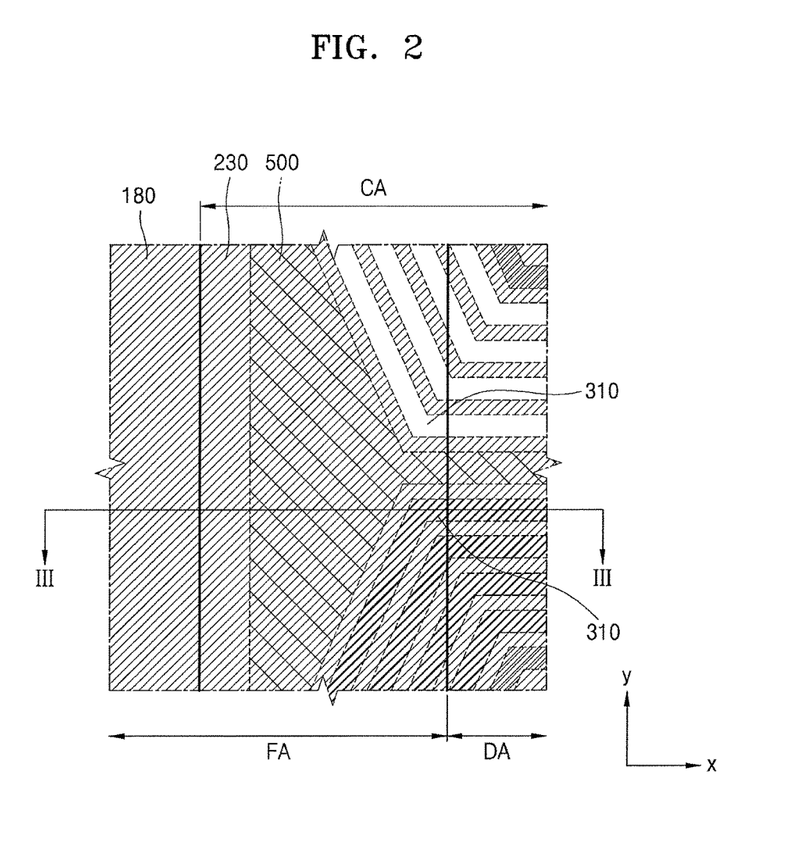
FIG. 2 illustrates a schematic enlarged view of a portion II of FIG. 1.
Figure 3:
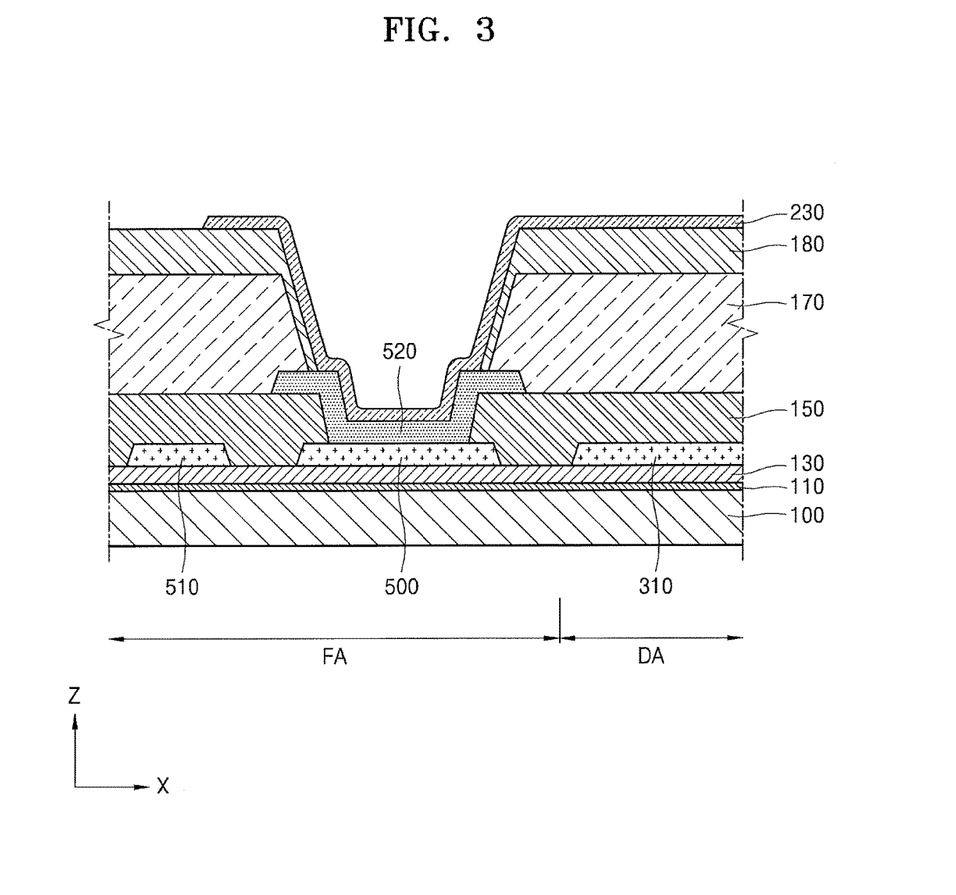
FIG. 3 illustrates a schematic cross-sectional view taken along a line of FIG. 2.

FIG. 1 illustrates a schematic plan view of an organic light-emitting display apparatus according to an exemplary embodiment. FIG. 2 illustrates a schematic enlarged view of a portion II of FIG. 1. FIG. 3 illustrates a schematic cross-sectional view taken along a line of FIG. 2.

Referring to FIGS. 1 and 2, an organic light-emitting display apparatus 1 according to an exemplary embodiment may include a substrate 100, a plurality of pixel electrodes 210, a plurality of first line portions 300, a plurality of second line portions 400, and a dummy pattern 500. The first line portions 300 may include a plurality of first signal lines 310 connected to the pixel electrodes 210 in one direction, and the second line portions 400 may include a plurality of second signal lines 410 intersecting the first signal lines 310.

The substrate 100 may be formed of various materials such as glass materials, metal metallic materials, or plastic materials such as polyethylen terephthalate (PET), polyethylen naphthalate (PEN), and polyimide. The substrate 100 may include a display region DA in which a plurality of pixels PX may be disposed and a fan-out region FA surrounding the display region DA.

The display region DA may be a region in which an image may be displayed and the pixels PX may be arranged in a matrix configuration. The display region DA may be disposed at a center portion of the substrate 100. The signal lines 310 and 410 disposed in the display region DA may be electrically connected to the pixel electrodes 210. The signal lines 310 and 410 may include gate lines 310 formed in an X-axis direction and data lines 410 formed in a Y-axis direction, the gate lines 310 and the data lines 410 may intersect each other to define the display region DA, and the distance between the lines may be determined according to the size of the pixel PX. The distance between the signal lines 310 and 410 in the display region DA may be greater than the distance between the signal lines 310 and 410 in the fan-out region FA, the signal lines 310 and 410 passing through the display region DA may be concentrated on one point in the fan-out region FA, and the distance between the signal lines 310 and 410 may decrease gradually.

Driving units 320 and 420 may be disposed at points of the fan-out region FA on which the signal lines 310 and 410 may be concentrated. The driving units 320 and 420 may supply power, a common voltage (Vcom), a control signal, a data signal, and a gate signal to drive the display apparatus. The signal lines 310 and 410 may be connected to the driving units 320 and 420 at the end portion of the fan-out region FA. For example, the gate line 310 may be electrically connected to the gate driving unit 320 through a gate pad, and the data line 410 may be electrically connected to the data driving unit 420 through a data pad.

The gate driving unit 320 may include a plurality of gate driving integrated circuits (ICs) 322, and the data driving unit 420 may include a plurality of data driving ICs 422. FIG. 1 illustrates a predetermined number of gate driving ICs 322 and a predetermined number of data driving ICs 422. In embodiments, the number of driving ICs may vary.

The driving units 320 and 420 may have various forms. For example, the driving units 320 and 420 may be mounted on the fan-out region FA of the substrate 100 in the form of at least one IC chip, or may be mounted on a flexible printed circuit board (FPCB) and then attached to the fan-out region FA in the form of a tape carrier package (TCP). The driving units 320 and 420 may be mounted on an FPCB attached to the end portion of the fan-out region FA.

As described above, the signal lines 310 and 410 connected respectively to the driving ICs in the fan-out region FA may be concentrated, e.g., may come together or converge, in an approximately trapezoidal shape to constitute, e.g., make up or form, the line portions 300 and 400. The first signal lines 310 may be concentrated in the fan-out region FA to constitute the first line portions 300, and the second signal lines 410 may be concentrated in the fan-out region FA to constitute the second line portions 400.

An opposite electrode 230 may be formed between the second line portions 400 to cover a space between the second line portions 400 and a power line may be capped with an organic layer, and light leakage may be almost insignificant in the fan-out region FA in which the second line portions 400 may be disposed. A covering region of the opposite electrode 230 between the first line portions 300 may be narrow and a power line may not be fully capped with an organic layer, light leakage may occur between the first line portions 300, and as illustrated in FIG. 2, the dummy pattern 500 may be disposed between the first line portions 300 to help prevent light leakage between the first line portions 300.

Referring to FIGS. 2 and 3, the dummy pattern 500 may be disposed between the first line portions 300. The dummy pattern 500 may be approximately triangular. The first signal lines 310 constituting the first line portions 300 may be concentrated at the gate driving unit 320 in a trapezoidal shape, and a triangular space may be formed between the first line portions 300 and the dummy pattern 500 may be disposed in the triangular space. In order to help prevent light leakage between the first line portions 300, the dummy pattern 500 may be formed to be most adjacent to the first line portions 300.

As illustrated in FIG. 3, the first signal line 310 may be disposed on one side of the dummy pattern 500. The dummy pattern 500 may be disposed on the same layer as the first signal line 310. The first signal line 310, which may be a gate line, may be disposed on the same layer as a gate electrode 140 of a thin film transistor TFT disposed in the display region DA and may be simultaneously patterned in a manufacturing process. The dummy pattern 500 may be disposed on the same layer as the gate electrode 140 of the thin film transistor TFT and may be simultaneously patterned in the manufacturing process, and the dummy pattern 500 may include a metal material. For example, the dummy pattern 500 may be formed of one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

A power line 510 may be disposed on the other side of the dummy pattern 500. A current may be supplied to elements of the display region DA through the power line 510, and static electricity may be generated at the power line 510 and the generated static electricity may be concentrated on the dummy pattern 500.

The dummy pattern 500 may be disposed between the first line portions 300 and may be provided as an island-type pattern that is not connected to any element. The dummy pattern 500 may cover a space between the first line portions 300 to help prevent light leakage therebetween. The dummy pattern 500 may not be connected to any element, and static electricity may be concentrated on the dummy pattern 500. The static electricity concentrated on the dummy pattern 500 may cause a turn-on defect in the pixel connected thereto through the first signal line 310 that is most adjacent to the dummy pattern 500, a top portion of the dummy pattern 500 may be exposed to contact the opposite electrode 230, and the static electricity concentrated on the dummy pattern 500 may be distributed.

The opposite electrode 230 may be a common electrode that may be formed as one united body on an entire surface of the substrate 100. The opposite electrode 230 may be disposed to face the pixel electrodes 210, and may be electrically connected to the dummy pattern 500. To be electrically connected to the dummy pattern 500, the opposite electrode 230 may be disposed to extend to the fan-out region FA. The opposite electrode 230 may be formed to extend between the first line portions 300. FIG. 2 illustrates a cathode region CA in which the opposite electrode 230 may be formed to extend. The cathode region CA may extend in an outward direction (a −x direction) of the substrate 100 to cover the dummy pattern 500 disposed under the opposite electrode 230.

Referring to FIG. 3, in the present exemplary embodiment, a first insulating layer 150, a second insulating layer 170, and a third insulating layer 180 may be disposed on the dummy pattern 500. The first insulating layer 150, the second insulating layer 170, and the third insulating layer 180 disposed on the dummy pattern 500 may be patterned to expose a top surface of the dummy pattern 500, and the top surface of the dummy pattern 500 may be electrically connected to the opposite electrode 230.

A metal layer 520 may be disposed between the dummy pattern 500 and the opposite electrode 230. The metal layer 520 may be disposed on the same layer as a source electrode 160 and a drain electrode 162 of the thin film transistor TFT disposed in the display region DA and may be simultaneously patterned in the manufacturing process. The metal layer 520 may include a metal material and may be formed of, for example, one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

The dummy pattern 500 may cover the space between the first line portions 300 to help prevent light leakage therebetween. The top portion of the dummy pattern 500 may be exposed to contact the opposite electrode 230, and the static electricity concentrated on the dummy pattern 500 may be distributed to help minimize a pixel defect that may be caused by the static electricity.

Figure 4:
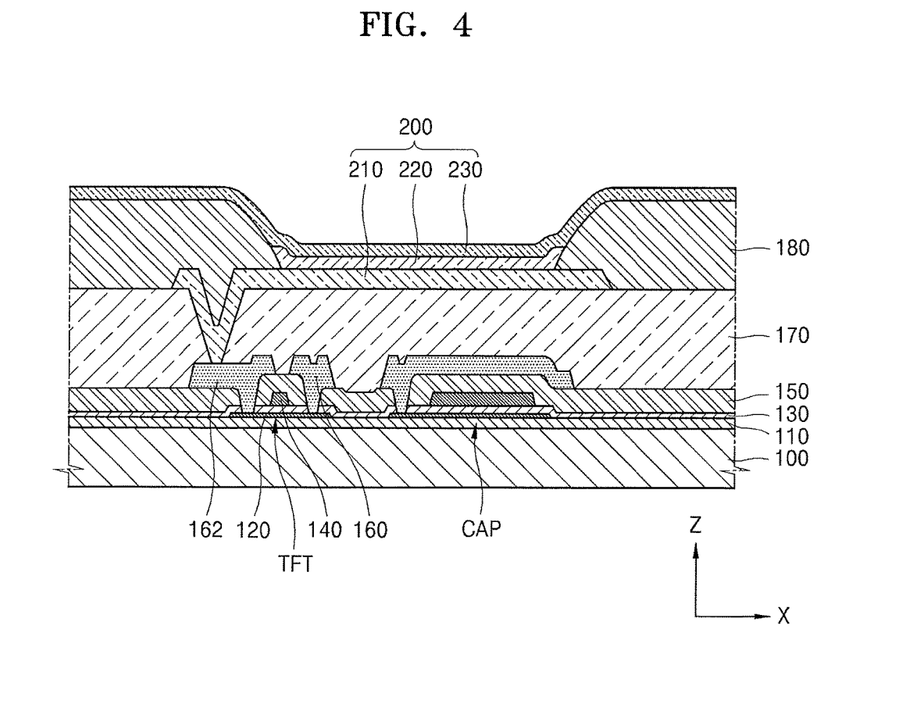
FIG. 4 illustrates a schematic cross-sectional view of a pixel of a display region of FIG. 1.

FIG. 4 illustrates a schematic cross-sectional view of a pixel of the display region DA of FIG. 1.

A barrier layer 110 may be disposed on a top surface of the substrate 100. The barrier layer 110 may be formed to help prevent impurities from flowing into an organic light-emitting device (OLED) or a thin film transistor TFT formed on the substrate 100. The barrier layer 110 may be formed of a material such as silicon oxide or silicon nitride to have a single-layer structure or a multi-layer structure.

A thin film transistor TFT and a capacitor CAP may be disposed on the barrier layer 110, and an OLED may be electrically connected to the thin film transistor TFT. The thin film transistor TFT may include a semiconductor layer 120 including amorphous silicon, polycrystalline silicon, or an organic semiconductor material, a gate electrode 140, a source electrode 160, and a drain electrode 162. A structure of the thin film transistor TFT will be described below in detail.

First, to planarize the surface of the substrate 100 or prevent impurities from penetrating into the semiconductor layer 120 of the thin film transistor TFT, a barrier layer 110 formed of silicon oxide or silicon nitride may be disposed on the substrate 100, and the semiconductor layer 120 may be disposed on the barrier layer 110.

The gate electrode 140 may be disposed on the semiconductor layer 120, and the source electrode 160 and the drain electrode 162 may be electrically connected according to a signal applied to the gate electrode 140. In consideration of, for example, adhesion to an adjacent layer, surface evenness of a stacked layer, and processability, the gate electrode 140 may be formed to have a single-layer structure or a multi-layer structure including, for example, one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

For insulation between the semiconductor layer 120 and the gate electrode 140, a gate insulating layer 130 formed of silicon oxide and/or silicon nitride may be disposed between the semiconductor layer 120 and the gate electrode 140.

The first insulating layer 150 may be disposed on the gate electrode 140. The first insulating layer 150 may be understood as an interlayer insulating layer that electrically insulates the gate electrode 140, the source electrode 160, and the drain electrode 162. The first insulating layer 150 may be formed of a material such as silicon oxide or silicon nitride to have a single-layer structure or a multi-layer structure.

The source electrode 160 and the drain electrode 162 may be disposed on the first insulating layer 150. The source electrode 160 and the drain electrode 162 may be electrically connected to the semiconductor layer 120 through contact holes formed in the first insulating layer 150 and the gate insulating layer 130. In consideration of, for example, conductivity, the source electrode 160 and the drain electrode 162 may be formed to have a single-layer structure or a multilayer structure including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

A passivation layer may be disposed to cover the thin film transistor TFT to help protect the thin film transistor TFT. The passivation layer may be formed of, for example, an inorganic material such as silicon oxide, silicon nitride, or silicon oxynitride.

The second insulating layer 170 may be disposed on the substrate 100. The second insulating layer 170 may be a planarization layer or a passivation layer. The OLED may be disposed on the thin film transistor TFT, and the second insulating layer 170 may generally planarize the top surface of the thin film transistor TFT and may help protect the thin film transistor TFT and various elements. The second insulating layer 170 may be formed of for example, an acryl-based organic material or benzocyclobutene (BCB). As illustrated in FIG. 10, the barrier layer 110, the gate insulating layer 130, the first insulating layer 150, and the second insulating layer 170 may be formed on the entire surface of the substrate 100.

The third insulating layer 180 may be disposed on the thin film transistor TFT. The third insulating layer 180 may be a pixel definition layer. The third insulating layer 180 may be disposed on the second insulating layer 170 and may have an opening. The third insulating layer 180 may define a pixel region on the substrate 100.

The third insulating layer 180 may be, for example, an organic insulating layer. The organic insulating layer may include an acryl-based polymer such as polymethylmethacrylate (PMMA), polystyrene (PS), a polymer derivative having a phenol group, an imide-based polymer, an arylether-based polymer, an amide-based polymer, a fluorine-based polymer, a p-xylene-based polymer, a vinylalcohol-based polymer, or a mixture thereof.

The barrier layer 110, the gate insulating layer 130, the first insulating layer 150, the second insulating layer 170, and the third insulating layer 180 may be disposed not only in the display region DA but also in a portion of the fan-out region FA.

An OLED 200 may be disposed on the third insulating layer 180. The OLED 200 may include a pixel electrode 210, an intermediate layer 220 including an emission layer (EML), and an opposite electrode 230.

The pixel electrode 210 may be formed of a transparent (or semitransparent) electrode or a reflective electrode. When the pixel electrode 210 is formed of a transparent (or semitransparent) electrode, the pixel electrode 210 may be formed of, for example, indium tin oxide (ITO), indium zinc oxide (IZO), zinc oxide (ZnO), indium oxide ($In_2O_3$), indium zinc oxide (IGO), or aluminum zinc oxide (AZO). When the pixel electrode 210 is formed of a reflective electrode, the pixel electrode 210 may include a reflective layer formed of Ag, Mg, Al, Pt, Pd, Au, Ni, Nd, Ir, Cr, or a mixture thereof and a layer formed of ITO, IZO, ZnO, $In_2O_3$, IGO, or AZO. In an embodiment, the pixel electrode 210 may be formed of various other materials and may be variously modified to have, for example, a single-layer structure or a multi-layer structure.

The intermediate layer 220 may be disposed in the pixel region defined by the third insulating layer 180. The intermediate layer 220 may include an emission layer EML emitting light by an electrical signal and may further include a stack structure of a hole transport layer HTL and a hole injection layer HIL disposed between the emission layer EML and the pixel electrode 210, and an electron injection layer EIL and an electron transport layer ETL disposed between the emission layer EML and the opposite electrode 230. In an embodiment, the intermediate layer 220 may have various other structures. The hole transport layer HTL, the hole injection layer HIL, the electron transport layer ETL, and the electron injection layer EIL may be formed as one united body on the entire surface of the substrate 100, and only the emission layer EML may be formed in each pixel by an ink-jet printing process.

The opposite electrode 230, which may face the pixel electrode 210 and may cover the intermediate layer 220 including the emission layer EML, may be disposed over the entire surface of the substrate 100. The opposite electrode 230 may be formed of a transparent (or semitransparent) electrode or a reflective electrode.

The opposite electrode 230 may be formed of a transparent (or semitransparent) electrode, and the opposite electrode 230 may include a layer formed of metal having a low work function, such as Li, Ca, LiF/Ca, LiF/Al, Al, Ag, Mg, or a mixture thereof, and a transparent (or semitransparent) conductive layer formed of ITO, IZO, ZnO, or $In_2O_3$. The opposite electrode 230 may be formed of a reflective electrode, and the opposite electrode 230 may include a layer formed of Li, Ca, LiF/Ca, LiF/Al, Al, Ag, Mg, or a mixture thereof. In an embodiment, the structure and material of the opposite electrode 230 may be variously modified.

Figure 5:
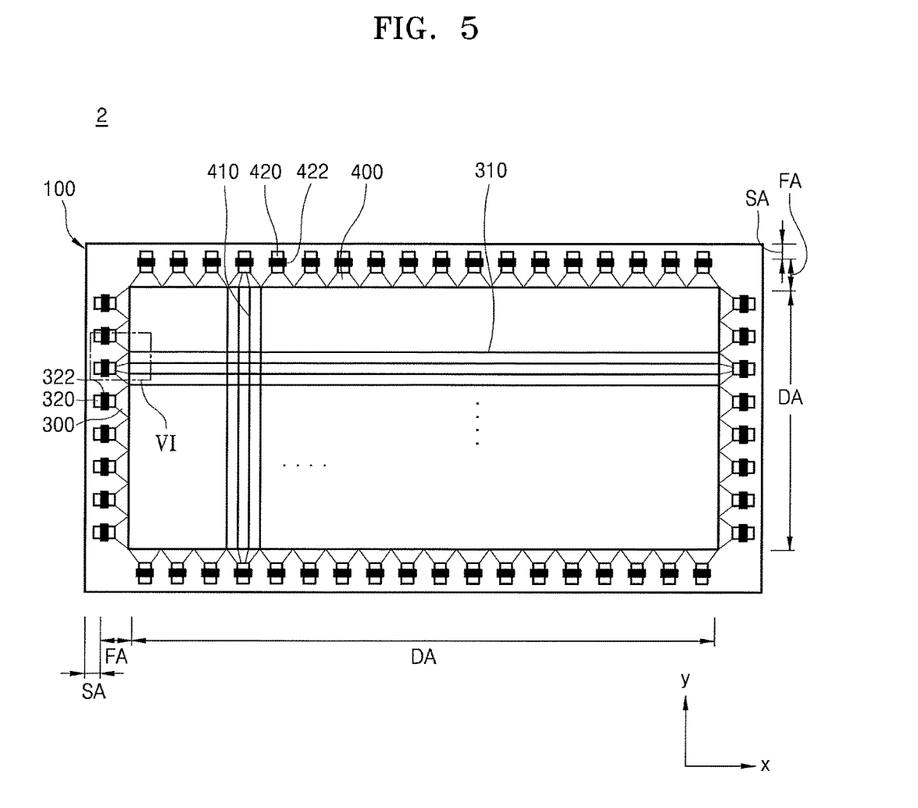
FIG. 5 illustrates a schematic plan view of an organic light-emitting display apparatus according to an exemplary embodiment.
Figure 6:
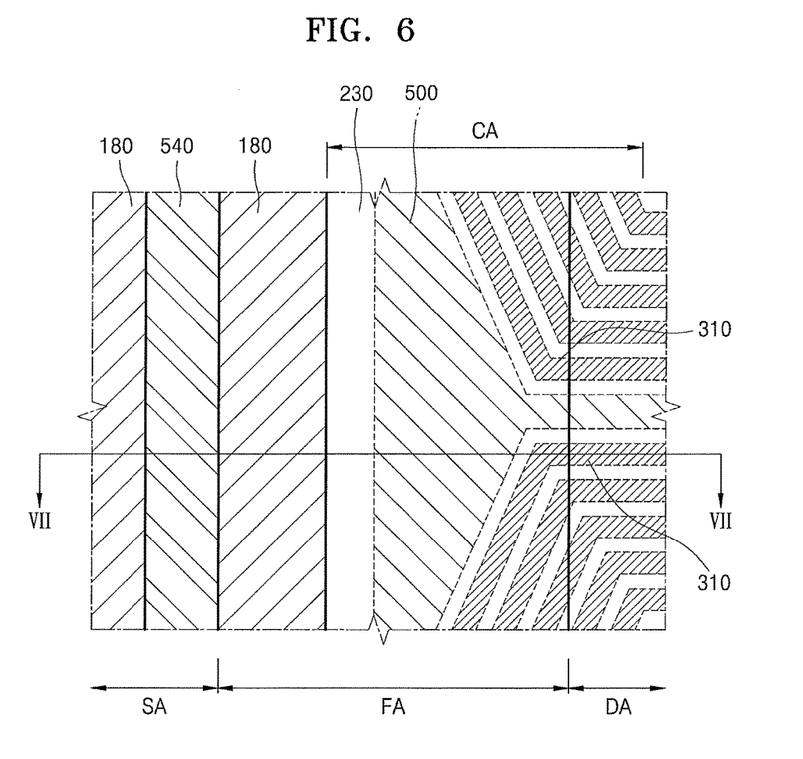
FIG. 6 illustrates a schematic enlarged view of a portion VI of FIG. 5.
Figure 7:
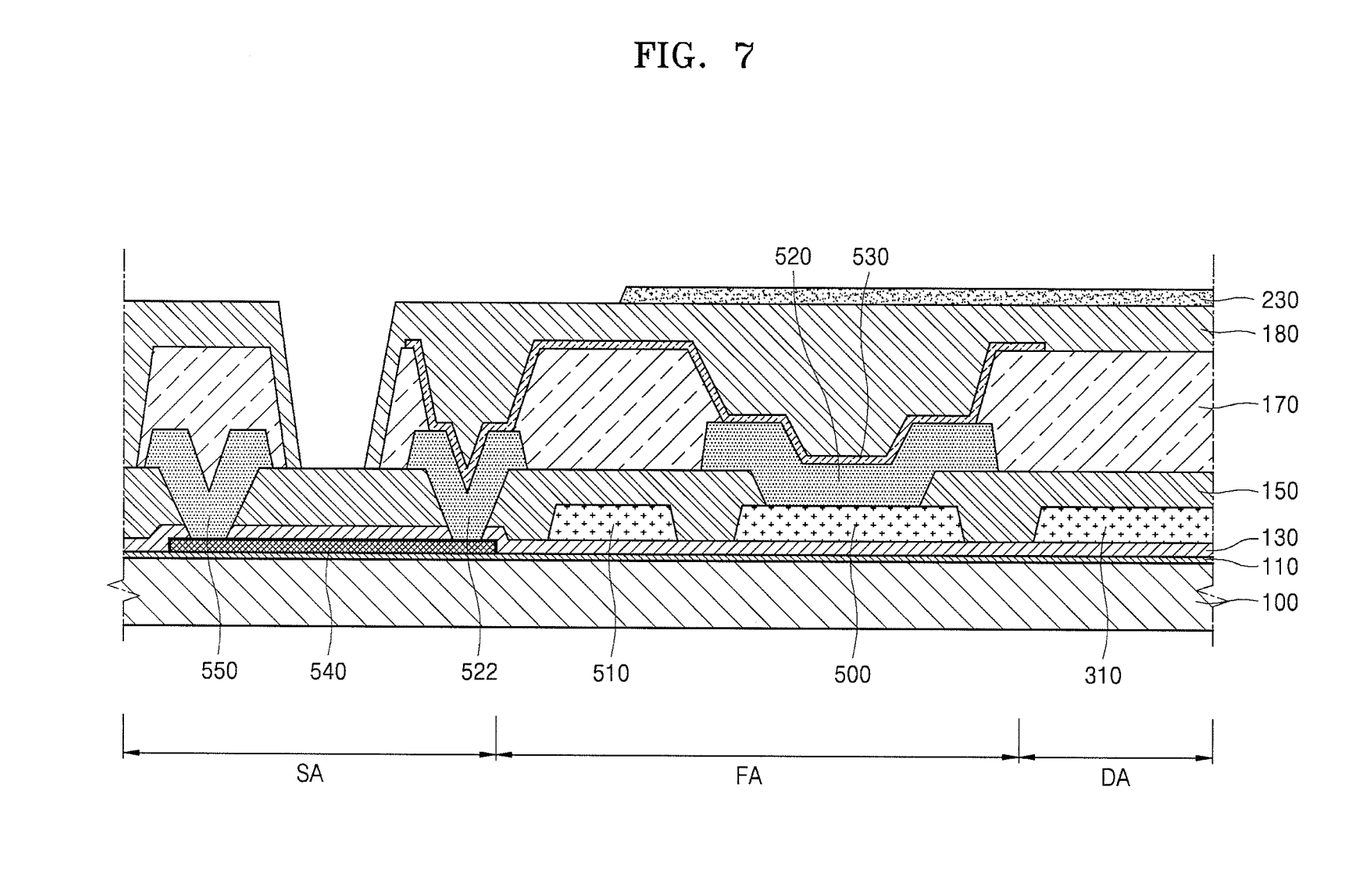
FIG. 7 illustrates a schematic cross-sectional view taken along a line VII-VII of FIG. 6.

FIG. 5 illustrates a schematic plan view of an organic light-emitting display apparatus according to an exemplary embodiment. FIG. 6 illustrates a schematic enlarged view of a portion VI of FIG. 5. FIG. 7 illustrates a schematic cross-sectional view taken along a line VII-VII of FIG. 6.

Referring to FIGS. 5 and 6, an organic light-emitting display apparatus 2 according to an exemplary embodiment may include a substrate 100, a plurality of pixel electrodes 210, a plurality of first line portions 300, a plurality of second line portions 400, and a dummy pattern 500. The first line portions 300 may include a plurality of first signal lines 310 connected to the pixel electrodes 210 in one direction, and the second line portions 400 may include a plurality of second signal lines 410 intersecting the first signal lines 310.

The substrate 100 may be formed of various materials such as glass materials, metal metallic materials, or plastic materials such as polyethylen terephthalate (PET), polyethylen naphthalate (PEN), and polyimide. The substrate 100 may include a display region DA in which a plurality of pixels may be disposed, a fan-out region FA surrounding the display region DA, and a sealing region SA outside the fan-out region FA. The display region DA and the fan-out region FA have been described above with reference to FIGS. 1 to 3, and redundant description thereof will be omitted herein.

A guide line 550 may be disposed outside of the sealing region SA of the substrate 100. The guide line 550 may be electrically connected to a first line pattern 530 and a second line pattern 540 that will be described later.

The signal lines 310 and 410 connected respectively to a plurality of driving ICs in the fan-out region FA may be concentrated in an approximately trapezoidal shape to constitute the line portions 300 and 400. The first signal lines 310 may be concentrated in the fan-out region FA to constitute the first line portions 300, and the second signal lines 410 may be concentrated in the fan-out region FA to constitute the second line portions 400.

An opposite electrode 230, which will be described later, may be formed between the second line portions 400 to cover a space between the second line portions 400 and a power line is capped with an organic layer, and light leakage may be almost insignificant in the fan-out region FA in which the second line portions 400 may be disposed. A covering region of the opposite electrode 230 between the first line portions 300 may be narrow and a power line may not be fully capped with an organic layer, light leakage may occur between the first line portions 300, and as illustrated in FIG. 2, the dummy pattern 500 may be disposed between the first line portions 300 to help prevent light leakage between the first line portions 300.

Referring to FIGS. 2 and 3, the dummy pattern 500 may be disposed between the first line portions 300. The dummy pattern 500 may be approximately triangular. The first signal lines 310 constituting the first line portions 300 may be concentrated at the gate driving unit 320 in a trapezoidal shape, and a triangular space may be formed between the first line portions 300 and the dummy pattern 500 may be disposed in the triangular space. To help prevent light leakage between the first line portions 300, the dummy pattern 500 may be formed to be most adjacent to the first line portions 300.

As illustrated in FIG. 3, the first signal line 310 may be disposed on one side of the dummy pattern 500. The dummy pattern 500 may be disposed on the same layer as the first signal line 310. The first signal line 310, which may be a gate line, may be disposed on the same layer as a gate electrode 140 of a thin film transistor TFT disposed in the display region DA and may be simultaneously patterned in a manufacturing process. The dummy pattern 500 may be disposed on the same layer as the gate electrode 140 of the thin film transistor TFT and may be simultaneously patterned in the manufacturing process, and the dummy pattern 500 may include a metal material. For example, the dummy pattern 500 may be formed of one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

A power line 510 may be disposed on the other side of the dummy pattern 500. A current may be supplied to elements of the display region DA through the power line 510, static electricity may be generated at the power line 510, and the generated static electricity may be concentrated on the dummy pattern 500.

The dummy pattern 500 may be disposed between the first line portions 300 and may be provided as an island-type pattern that is not connected to any element. The dummy pattern 500 may cover a space between the first line portions 300 to help prevent light leakage therebetween. The dummy pattern 500 may not be connected to any element, and static electricity may be concentrated on the dummy pattern 500. The static electricity concentrated on the dummy pattern 500 may cause a turn-on defect in the pixel connected thereto through the first signal line 310 that is most adjacent to the dummy pattern 500, a top portion of the dummy pattern 500 may be exposed to contact one end portion of the first line pattern 530, and the static electricity concentrated on the dummy pattern 500 may be distributed.

In the present exemplary embodiment, a first insulating layer 150, a second insulating layer 170, and a third insulating layer 180 may be disposed on the dummy pattern 500. The first insulating layer 150 and the second insulating layer 170 disposed on the dummy pattern 500 may be patterned to expose a top surface of the dummy pattern 500, and the top surface of the dummy pattern 500 may be electrically connected to the first line pattern 530.

The first line pattern 530 may be disposed on the same layer as the pixel electrodes 210 disposed in the display region DA and may be simultaneously patterned in the manufacturing process, and for example, the first line pattern 530 may be formed of a semitransparent or transparent layer formed of ITO, IZO, ZnO, In$_2$O$_3$, IGO, or AZO, or may be formed of a reflective layer formed of Ag, Mg, Al, Pt, Pd, Au, Ni, Nd, Ir, Cr, or a mixture thereof. The first line pattern 530 may be formed of a multi-layer structure of the transparent layer and the reflective layer.

A metal layer 520 may be disposed between the dummy pattern 500 and the first line pattern 530. The metal layer 520 may be disposed on the same layer as a source electrode 160 and a drain electrode 162 of the thin film transistor TFT disposed in the display region DA and may be simultaneously patterned in the manufacturing process. The metal layer 520 may include a metal material and may be formed of, for example, one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

The second line pattern 540 may be disposed on the sealing region SA of the substrate 100. FIG. 7 illustrates an exemplary embodiment in which the second line pattern 540 may be disposed on a barrier layer 110. When the second line pattern 540 is disposed on the barrier layer 110 as illustrated in FIG. 7, the second line pattern 540 may be simultaneously patterned and formed while including the same material as the semiconductor layer 120 of the thin film transistor TFT disposed in the display region DA. In an embodiment, the second line pattern 540 may be simultaneously patterned while including the same material as the gate electrode 140 of the thin film transistor TFT disposed in the display region DA.

As described above, one end portion of the first line pattern 530 may be electrically connected to the dummy pattern 500, and the other end portion of the first line pattern 530 may be electrically connected to one end portion of the second line pattern 540.

A metal layer 522 may be disposed between the other end portion of the first line pattern 530 and one end portion of the second line pattern 540. The metal layer 522 may be disposed on the same layer as a source electrode 160 and a drain electrode 162 of the thin film transistor TFT disposed in the display region DA and may be simultaneously patterned in the manufacturing process. The metal layer 522 may include a metal material and may be formed of, for example, one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu).

As described above, one end portion of the second line pattern 540 may be electrically connected to the first line pattern 530, and the other end portion of the second line pattern 540 may be electrically connected to the guide line 550.

Static electricity generated at the power line 510 may be concentrated on the dummy pattern 500. The static electricity concentrated on the dummy pattern 500 may flow into one end portion of the first line pattern 530 contacting the metal layer 520, and may be transmitted and distributed to the guide line 550 through the second line pattern 540 that is electrically connected to the other end portion of the first line pattern 530. The dummy pattern 500 may cover the space between the first line portions 300 to help prevent light leakage therebetween. The top portion of the dummy pattern 500 may be exposed to contact the guide line 550 through the first line pattern 530 and the second line pattern 540, and the static electricity concentrated on the dummy pattern 500 may be distributed to help minimize a pixel defect that may be caused by the static electricity.

Organic light-emitting display apparatuses have been mainly described. Exemplary embodiments also include methods of manufacturing organic light-emitting display apparatuses.

Referring to FIGS. 1 to 4, a substrate 100 including a display region DA and a fan-out region FA outside the display region DA may be prepared. The substrate 100 may be formed of various materials such as glass materials, metal metallic materials, or plastic materials such as polyethylen terephthalate (PET), polyethylen naphthalate (PEN), and polyimide. The substrate 100 may include a display region DA in which a plurality of pixels PX may be disposed and a fan-out region FA surrounding the display region DA.

Thereafter, a plurality of pixel electrodes 210 may be patterned in the display region DA of the substrate 100. Thereafter, an intermediate layer 220 may be formed in each of the pixel electrodes 210, and an opposite electrode 230 facing the pixel electrodes 210 may be formed on the intermediate layer 220. An OLED and a thin film transistor TFT formed in the display region DA have been described above with reference to FIG. 4, and redundant descriptions thereof will be omitted herein.

Before forming the pixel electrodes 210, signal lines 310 and 410 transmitting electrical signals to the pixel electrodes 210 may be formed. A plurality of first line portions 300 including a plurality of first signal lines 310 connected electrically to the pixel electrodes 210 in the display region DA in one direction and concentrated in the fan-out region FA may be formed. A plurality of second line portions 400 including a plurality of second signal lines 410 connected electrically to the pixel electrodes 210 in the display region DA to intersect the first signal lines 310 and concentrated in the fan-out region FA may be formed.

The first signal lines 310 may be gate lines, and the second signal lines 410 may be data lines.

A dummy pattern 500 may be formed between the first line portions 300. The dummy pattern 500 may be formed to be approximately triangular. The first signal lines 310 constituting the first line portions 300 may be concentrated at the gate driving unit 320 in a trapezoidal shape, and a triangular space may be formed between the first line portions 300 and the dummy pattern 500 may be formed in the triangular space. To help prevent light leakage between the first line portions 300, the dummy pattern 500 may be formed to be most adjacent to the first line portions 300.

Forming the first line portions 300 and forming the dummy pattern 500 may be simultaneously performed. As illustrated in FIG. 3, the first signal line 310 may be formed on one side of the dummy pattern 500. The first signal line 310, which may be a gate line, may be formed on the same layer as the gate electrode 140 of the thin film transistor TFT disposed in the display region DA and may be simultaneously patterned in the manufacturing process. The dummy pattern 500 may be formed on the same layer as the gate electrode 140 of the thin film transistor TFT and may be simultaneously patterned in the manufacturing process, and the dummy pattern 500 may include a metal material.

A power line 510 may be formed on the other side of the dummy pattern 500. A current may be supplied to elements of the display region DA through the power line 510, static electricity may be generated at the power line 510, and the generated static electricity may be concentrated on the dummy pattern 500.

The dummy pattern 500 may be formed between the first line portions 300 and may be provided as an island-type pattern that is not connected to any element. The dummy pattern 500 may cover a space between the first line portions 300 to help prevent light leakage therebetween. The dummy pattern 500 may not be connected to any element, and static electricity may be concentrated on the dummy pattern 500. The static electricity concentrated on the dummy pattern 500 may cause a turn-on defect in the pixel connected thereto through the first signal line 310 that is most adjacent to the dummy pattern 500, a top portion of the dummy pattern 500 may be exposed to contact the opposite electrode 230, and the static electricity concentrated on the dummy pattern 500 may be distributed.

The opposite electrode 230 may be a common electrode that may be formed as one united body on the entire surface of the substrate 100. The opposite electrode 230 may be disposed to face the pixel electrodes 210, and may be electrically connected to the dummy pattern 500. To be electrically connected to the dummy pattern 500, the opposite electrode 230 may be formed to extend to the fan-out region FA. In the present exemplary embodiment, a first insulating layer 150, a second insulating layer 170, and a third insulating layer 180 may be formed on the dummy pattern 500. The first insulating layer 150, the second insulating layer 170, and the third insulating layer 180 disposed on the dummy pattern 500 may be patterned to expose a top surface of the dummy pattern 500, and the top surface of the dummy pattern 500 may be electrically connected to the opposite electrode 230.

A metal layer 520 may be formed between forming the dummy pattern 500 and forming the opposite electrode 230. The metal layer 520 may be patterned and formed simultaneously with the source electrode 160 and the drain electrode 162 of the thin film transistor TFT disposed in the display region DA.

The dummy pattern 500 may cover the space between the first line portions 300 to help prevent light leakage therebetween. The top portion of the dummy pattern 500 may be exposed to contact the opposite electrode 230, and the static electricity concentrated on the dummy pattern 500 may be distributed to help minimize a pixel defect that may be caused by the static electricity.

By way of summation and review, in an organic light-emitting display apparatus, thin film transistors and organic light-emitting devices may be formed on a substrate, and the organic light-emitting devices may emit light for the operation of the organic light-emitting display apparatus. The organic light-emitting display apparatus may be used as a display unit in a small-sized product such as a portable phone and as a display unit in a large-sized product such as a television.

An organic light-emitting display apparatus may have an organic light-emitting device, which may include a pixel electrode, an opposite electrode, and an intermediate layer disposed between the pixel electrode and the opposite electrode and including an emission layer, as each pixel (or sub-pixel). In an organic light-emitting display apparatus, a thin film transistor connected electrically to the pixel electrode may be used to control the light emission state or level of each pixel, and the opposite electrode may be formed as one united body in a plurality of pixels (or sub-pixels).

In an organic light-emitting display apparatus, static electricity may be concentrated on a fan-out line and the concentrated static electricity may cause a turn-on defect in a pixel, and it may be difficult to display a high-quality image.

One or more exemplary embodiments relate to organic light-emitting display apparatuses and methods of manufacturing the same, which may easily prevent a display circuit line defect by distributing static electricity concentrated on a fan-out line.

As described above, according to the one or more of the above exemplary embodiments, it is possible to implement organic light-emitting display apparatuses and methods of manufacturing the same, which may easily prevent a display circuit line defect by distributing static electricity concentrated on a fan-out line.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a substrate including a display region, a fan-out region outside the display region, and a sealing region outside the fan-out region;
    a plurality of pixel electrodes in the display region of the substrate;
    a plurality of first signal lines electrically connected to the pixel electrodes in the display region in one direction and constituting a plurality of first line portions in the fan-out region;
    a plurality of second signal lines electrically connected to the pixel electrodes in the display region to intersect the first signal lines and constituting a plurality of second line portions in the fan-out region; and
    a dummy pattern between the first line portions,
    wherein:
    a first line pattern is on the fan-out region,
    a second line pattern is on the sealing region,
    a first end of the first line pattern is electrically connected to the dummy pattern, and
    a second end of the first line pattern is electrically connected to a first end of the second line pattern.

2. The organic light-emitting display apparatus as claimed in claim 1, wherein:
    the first signal lines are gate lines, and
    the second signal lines are data lines.

3. The organic light-emitting display apparatus as claimed in claim 1, wherein the dummy pattern is on a same layer as the first signal lines.

4. The organic light-emitting display apparatus as claimed in claim 1, further comprising an opposite electrode facing the pixel electrodes,
    wherein the dummy pattern is electrically connected to the opposite electrode.

5. The organic light-emitting display apparatus as claimed in claim 4, wherein the opposite electrode extends to the fan-out region.

6. The organic light-emitting display apparatus as claimed in claim 5, further comprising a metal layer between the dummy pattern and the opposite electrode.

7. The organic light-emitting display apparatus as claimed in claim 1, wherein the dummy pattern between the first line portions is approximately triangular.

8. The organic light-emitting display apparatus as claimed in claim 1, wherein
    a guide line is outside of the sealing region.

9. The organic light-emitting display apparatus as claimed in claim 8, wherein a second end of the second line pattern is electrically connected to the guide line.

10. The organic light-emitting display apparatus as claimed in claim 1, further comprising:
    a metal layer between the dummy pattern and the first end of the first line pattern, and
    another metal layer between the second end of the first line pattern and the first end of the second line pattern.

11. The organic light-emitting display apparatus as claimed in claim 1, wherein the first line pattern is on a same layer as the pixel electrodes.

12. A method of manufacturing an organic light-emitting display apparatus, the method comprising:
    preparing a substrate including a display region, a fan-out region outside the display region, and a sealing region outside the fan-out region;
    patterning a plurality of pixel electrodes in the display region of the substrate;
    forming a plurality of first line portions including a plurality of first signal lines electrically connected to the pixel electrodes in the display region in one direction and concentrated in the fan-out region;
    forming a plurality of second line portions including a plurality of second signal lines electrically connected to the pixel electrodes in the display region to intersect the first signal lines and concentrated in the fan-out region;
    forming a dummy pattern between the first line portions; and
    forming a first line pattern on the fan-out region and a second line pattern on the sealing region such that:
    a first end of the first line pattern is electrically connected to the dummy pattern, and
    a second end of the first line pattern is electrically connected to a first end of the second line pattern.

13. The method as claimed in claim 12, wherein:
    the first signal lines are gate lines, and
    the second signal lines are data lines.

14. The method as claimed in claim 12, wherein the dummy pattern is formed simultaneously with the first signal lines.

15. The method as claimed in claim 12, further comprising forming an opposite electrode facing the pixel electrodes,
    wherein the dummy pattern is electrically connected to the opposite electrode.

16. The method as claimed in claim 15, wherein the opposite electrode extends to the fan-out region.

17. The method as claimed in claim 16, further comprising forming a metal layer between the dummy pattern and the opposite electrode to electrically connect the dummy pattern and the opposite electrode.

18. The method as claimed in claim 12, wherein the dummy pattern is approximately triangular.

* * * * *